(12) United States Patent
Tanabe

(10) Patent No.: US 11,121,241 B2
(45) Date of Patent: Sep. 14, 2021

(54) SEMICONDUCTOR DEVICE

(71) Applicant: DENSO CORPORATION, Kariya (JP)

(72) Inventor: Hiromitsu Tanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/066,327

(22) PCT Filed: Dec. 1, 2016

(86) PCT No.: PCT/JP2016/085660
§ 371 (c)(1),
(2) Date: Jun. 27, 2018

(87) PCT Pub. No.: WO2017/138231
PCT Pub. Date: Aug. 17, 2017

(65) Prior Publication Data
US 2019/0027592 A1    Jan. 24, 2019

(30) Foreign Application Priority Data

Feb. 10, 2016   (JP) .............................. JP2016-24046

(51) Int. Cl.
*H01L 29/739*        (2006.01)
*H01L 29/40*         (2006.01)
(Continued)

(52) U.S. Cl.
CPC ...... *H01L 29/7397* (2013.01); *H01L 29/0804* (2013.01); *H01L 29/0821* (2013.01);
(Continued)

(58) Field of Classification Search
None
See application file for complete search history.

(56) References Cited

U.S. PATENT DOCUMENTS 6,953,968 B2 * 10/2005 Nakamura ............ H01L 29/402
257/301
7,977,739 B2 * 7/2011 Kachi ............... H01L 29/42372
257/330

(Continued)

FOREIGN PATENT DOCUMENTS

JP    2003-188382 A    7/2003
JP    2008-021918 A    1/2008

*Primary Examiner* — David E Graybill
(74) *Attorney, Agent, or Firm* — Posz Law Group, PLC

(57) ABSTRACT

A semiconductor device includes a semiconductor substrate having first and second main surfaces, a first region formed in a surface layer of the first main surface, a drift layer disposed adjacent to the first region, a charge accumulation region having a higher concentration than the drift region, and a trench gate including a trench penetrating the first region and the charge accumulation region, and a gate electrode formed in the trench. The trench gate includes a main trench having a gate electrode to which a gate voltage is applied, and a dummy trench having a gate electrode to which a voltage different from the main trench is applied. The main trench and the dummy trench sandwiches the charge accumulation region, and a contact area S1 between the dummy trench and the charge accumulation region is larger than a contact area S2 between the main trench and the charge accumulation region.

6 Claims, 9 Drawing Sheets

(51) Int. Cl.
  *H01L 29/08*   (2006.01)
  *H01L 29/423*  (2006.01)
  *H01L 29/78*   (2006.01)

(52) U.S. Cl.
  CPC .......... *H01L 29/404* (2013.01); *H01L 29/407* (2013.01); *H01L 29/4236* (2013.01); *H01L 29/739* (2013.01); *H01L 29/7805* (2013.01); *H01L 29/7813* (2013.01)

(56) References Cited

U.S. PATENT DOCUMENTS

| | | | | |
|---|---|---|---|---|
| 8,154,073 B2* | 4/2012 | Aoki | ............... | H01L 29/0696 257/330 |
| 8,178,947 B2* | 5/2012 | Takahashi | ........... | H01L 29/7397 257/133 |
| 9,099,522 B2* | 8/2015 | Onozawa | ........... | H01L 29/0661 |
| 9,318,590 B2* | 4/2016 | Okawara | ............. | H01L 29/7397 |
| 9,425,271 B2* | 8/2016 | Saito | ................... | H01L 29/0696 |
| 9,634,130 B2* | 4/2017 | Onozawa | ........... | H01L 29/0661 |
| 9,673,309 B2* | 6/2017 | Onozawa | .......... | H01L 29/66348 |
| 10,236,372 B2* | 3/2019 | Okumura | ........ | H01L 21/02378 |
| 10,256,303 B2* | 4/2019 | Naito | ................. | H01L 27/0664 |
| 2003/0042537 A1 | 3/2003 | Nakamura et al. | | |
| 2004/0084722 A1 | 5/2004 | Yamaguchi et al. | | |
| 2004/0099905 A1* | 5/2004 | Baliga | ................ | H01L 29/0878 257/328 |
| 2005/0032291 A1* | 2/2005 | Baliga | ................ | H01L 29/0878 438/212 |
| 2005/0280029 A1 | 12/2005 | Nakamura et al. | | |
| 2008/0012050 A1 | 1/2008 | Aoki et al. | | |
| 2009/0283797 A1* | 11/2009 | Takahashi | ........... | H01L 29/7397 257/139 |
| 2010/0019314 A1* | 1/2010 | Kachi | ............... | H01L 29/42372 257/330 |
| 2011/0177663 A1* | 7/2011 | Kachi | ............... | H01L 29/42372 438/272 |
| 2011/0255347 A1* | 10/2011 | Mori | ........................ | G11C 7/18 365/185.25 |
| 2012/0112273 A1 | 5/2012 | Aoki et al. | | |
| 2012/0267680 A1* | 10/2012 | Oya | ................... | H01L 29/0696 257/139 |
| 2013/0009205 A1 | 1/2013 | Tsuzuki et al. | | |
| 2013/0037853 A1* | 2/2013 | Onozawa | ............ | H01L 29/0661 257/139 |
| 2014/0054645 A1* | 2/2014 | Saito | ................... | H01L 29/0696 257/139 |
| 2015/0318386 A1* | 11/2015 | Onozawa | ............. | H01L 29/0661 257/144 |
| 2016/0027906 A1* | 1/2016 | Onozawa | .......... | H01L 29/66348 257/144 |
| 2016/0064537 A1* | 3/2016 | Okawara | ............. | H01L 29/7397 257/139 |
| 2016/0336435 A1* | 11/2016 | Naito | ................... | H01L 29/7397 |
| 2017/0077004 A1* | 3/2017 | Onozawa | ........... | H01L 29/407 |
| 2017/0170274 A1* | 6/2017 | Wutte | ................. | H01L 29/4238 |
| 2017/0317175 A1* | 11/2017 | Naito | ................. | H01L 27/0664 |
| 2018/0033885 A1* | 2/2018 | Okumura | ......... | H01L 21/02378 |
| 2018/0182754 A1* | 6/2018 | Naito | .................... | H01L 21/765 |
| 2019/0027592 A1* | 1/2019 | Tanabe | ................. | H01L 29/739 |
| 2019/0280117 A1* | 9/2019 | Mirchandani | ....... | H01L 29/7813 |

* cited by examiner

SEMICONDUCTOR DEVICE

CROSS REFERENCE TO RELATED APPLICATIONS

This application is a U.S. national phase of International Application No. PCT/JP2016/085660 filed on Dec. 1, 2016, and is based on Japanese Patent Application No. 2016-24046 filed on Feb. 10, 2016, the disclosure of which is incorporated herein by reference.

TECHNICAL FIELD

The present disclosure relates to a semiconductor device including an insulated gate bipolar transistor having a charge accumulation region.

BACKGROUND ART

In trench gate insulated gate bipolar transistors (IGBT), some semiconductor devices have charge accumulation regions to reduce an on-voltage. In an IGBT having a charge accumulation region, a potential of the charge accumulation region changes when holes are supplied from a collector by turning on. In the IGBT having a trench gate, a gate capacitance may be observed as a negative value due to a displacement current generated in association with the potential change. The negative capacitance causes noises with respect to a switching control of the IGBT and becomes a factor of destabilizing the control of the IGBT.

Meanwhile, in a semiconductor device disclosed in Patent Literature 1, a clearance between a main gate to which a gate voltage is applied and a dummy gate at equipotential with an emitter potential, that is, a width of a charge accumulation region is set to be 1.4 µm or less. According to Patent Literature 1, when the width of the charge accumulation region is reduced, the potential change is reduced, and the negative capacitance is reduced.

However, the width required of the semiconductor device disclosed in Patent Literature 1 is 1.4 µm or less, which is realizable in the state of the art, but, an accuracy is not sufficient. In addition, when an impurity concentration of the charge accumulation region is increased for reducing the on-voltage more, a negative capacitance occurs even when the width is 1.4 µm or less.

PRIOR ART LITERATURES

Patent Literature

Patent Literature 1: JP 2009-277792 A

SUMMARY OF INVENTION

It is an object of the present disclosure to provide a semiconductor device that can restrict the generation of a negative capacitance while maintaining a low on-voltage.

A semiconductor device according to an aspect of the present disclosure includes a semiconductor substrate, a first region, a drift region, a charge accumulation region, a trench gate, and a second region. The semiconductor substrate has a first main surface and a second main surface that is a rear surface of the first main surface. The first region has a first conductivity type and is formed in a surface layer of the first main surface. The drift region has a second conductivity type and is formed between the first region and the second main surface so as to be adjacent to the first region. The charge accumulation region of the second conductivity type is formed adjacent to the drift region and has an impurity concentration higher than an impurity concentration of the drift region. The trench gate includes a trench that extends to a depth direction of the semiconductor substrate from the first main surface and penetrates the first region and the charge accumulation region, and a gate electrode formed in the trench via an insulation layer. The second region has a second conductivity type, is formed to be surrounded by the first region, and is exposed from the first main surface while being in contact with the trench gate.

The trench gate includes a main trench having the gate electrode to which a gate voltage is applied, and a dummy trench having the gate electrode to which a voltage different from the main trench is applied. The main trench and the dummy trench sandwiches the charge accumulation region, and a contact area between the dummy trench and the charge accumulation region is larger than a contact area between the main trench and the charge accumulation region.

The above-described semiconductor device can restrict the generation of a negative capacitance while maintaining the impurity concentration of the charge accumulation region to a concentration for realizing a predetermined on-voltage.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Embodiments of the present disclosure will be described below with reference to the accompanying drawings. In each of the following diagrams, parts that are the same or equivalent with each other are assigned with the same symbol. In addition, not only a combination of parts that are stated as being combinable in detail in each embodiments, but also the embodiments can be partially combined even without statement if a difficulty does not occur especially in the combination.

First Embodiment

Figure 1:
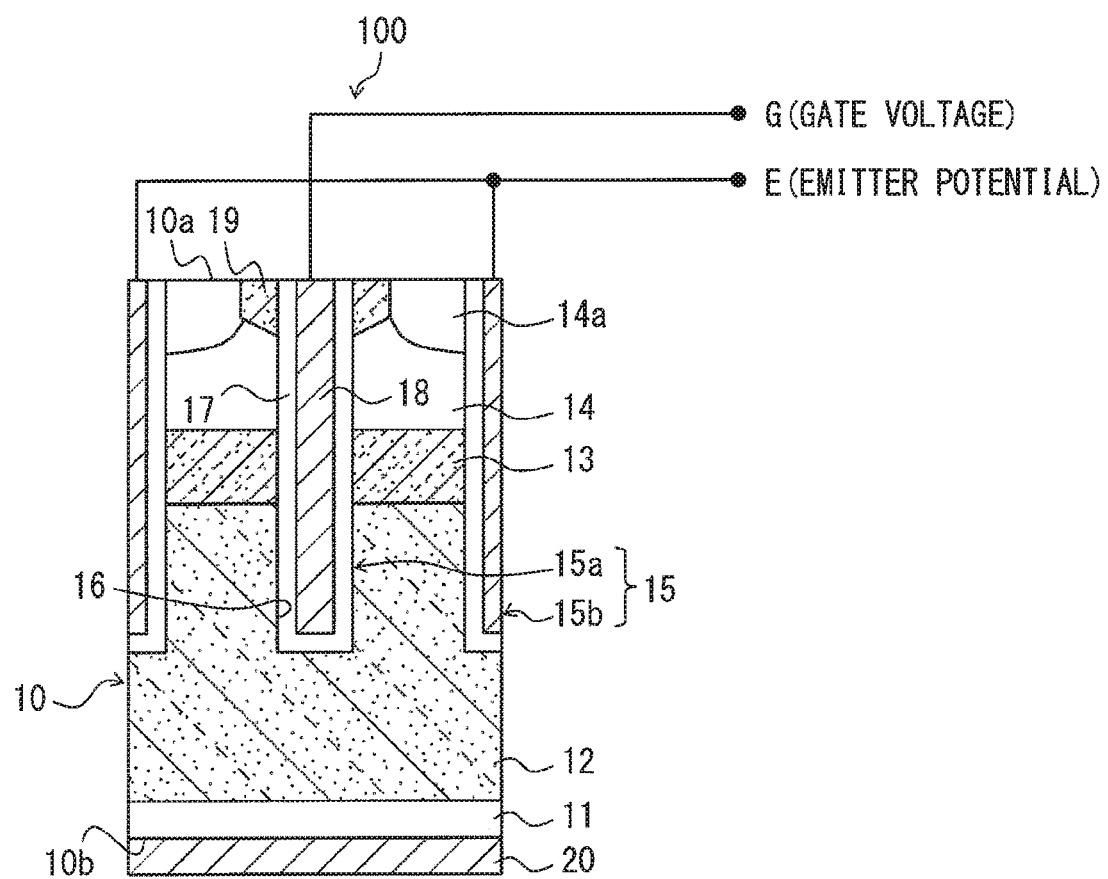
FIG. 1 is a cross-sectional view showing a schematic configuration of a semiconductor device according to a first embodiment.

At first, a semiconductor device according to the present embodiment will be described with reference to FIG. 1 and FIG. 2. FIG. 1 is a cross-sectional view taken along line I-I in FIG. 2.

The semiconductor device is, for example, a trench gate insulated gate bipolar transistor (IGBT). As shown in FIG. 1, a semiconductor device 100 is formed in a semiconductor substrate 10 having a first main surface 10a and a second main surface 10b that is a rear surface of the first main surface 10a. In the semiconductor device 100, a collector region 11 of p-conductivity type is formed in a surface layer of the second main surface 10b. A drift region 12 of n-conductivity type is formed so as to be adjacent to the collector region 11. A charge accumulation region 13 of n-conductivity type having an impurity concentration higher than the drift region 12 is formed so as to be adjacent to the drift region 12. In addition, a body region 14 is formed in the surface layer of the first main surface 10a so as to be adjacent to the charge accumulation region 13. The body region 14 in the present embodiment has a collector region 14a having an impurity concentration higher than the other region of the body region 14 on the outermost surface exposed from the first main surface 10a.

The semiconductor device 100 includes a trench gate 15 extending from the first main surface 10a to a depth direction. The trench gate 15 penetrates the body region 14 and the charge accumulation region 13 and reaches the drift region 12. The trench gate 15 includes a trench 16 extending from the first main surface 10a, an insulation layer 17 formed on an inner wall of the trench 16, and a gate electrode 18 formed in the trench 16 via the insulation layer 17. In addition, an emitter region 19 is formed in the surface layer of the first main surface 10a so as to be in contact with the trench gate 15 while being exposed from the first main surface 10a. The emitter region 19 is electrically coupled with an emitter electrode, which is not shown, on the first main surface 10a side. On the other hand, the collector region 11 is electrically coupled with the collector electrode 20 on the second main surface 10b side.

The trench gate 15 according to the present embodiment includes a main trench 15a having the gate electrode 18 to which a gate voltage is applied from a driving circuit, which is not shown, and a dummy trench 15b that is at equipotential with the emitter region 19. The emitter region 19 is formed so as to be adjacent to at least the main trench 15a. When the gate voltage is applied to the gate electrode 18 in the main trench 15a, a channel occurs in the body region 14 and an electric current flows between the emitter electrode and the collector electrode 20.

Figure 2:
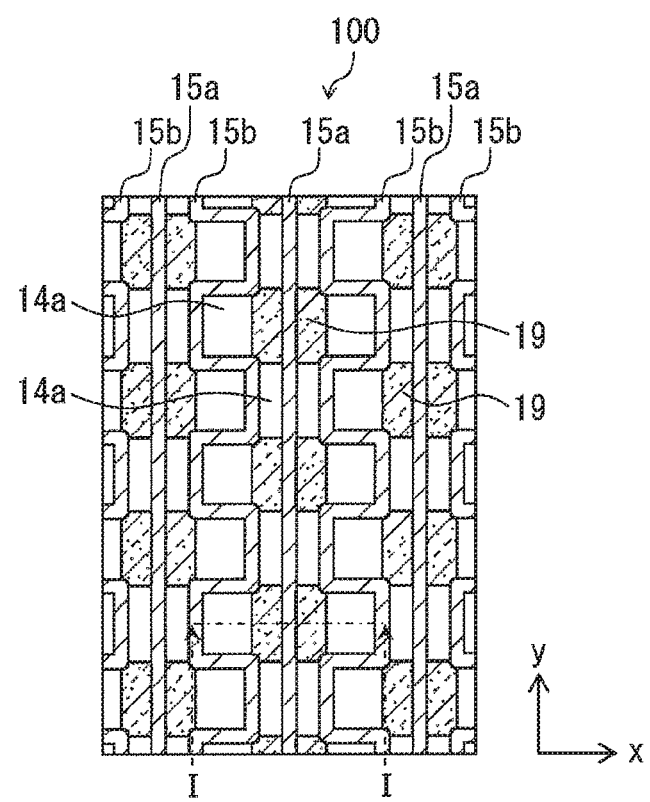
FIG. 2 is a top view showing shapes of trench gates.
Figure 3A:
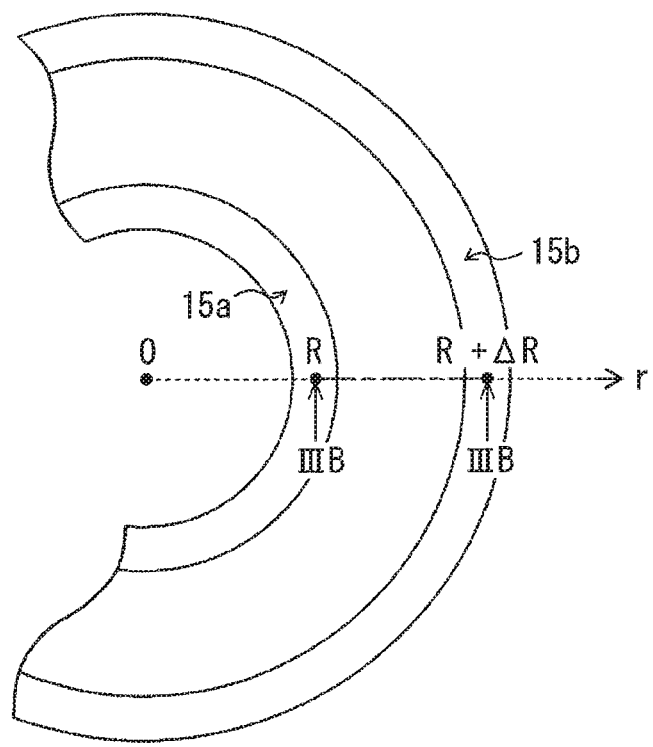
FIG. 3A is a top view of a simulation model.
Figure 3B:
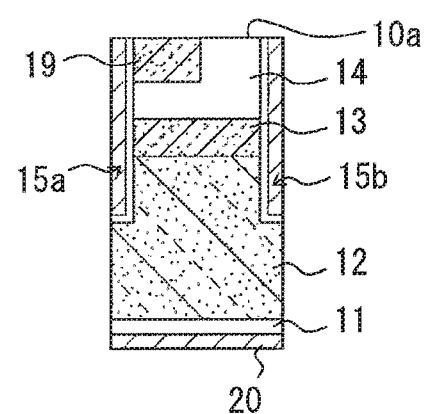
FIG. 3B is a cross-sectional view of the simulation model.

The main trench 15a in the semiconductor device 100 longitudinally extends in one direction in a top view of the first main surface 10a, as shown in FIG. 2. In FIG. 2, an extension direction (first direction) of the main trench 15a is set as a y-direction, and a direction orthogonal to the y-direction is set as an x-direction. A plurality of main trenches 15a is formed at equal intervals in the x-direction while extending linearly along the y-direction. On the other hand, the dummy trench 15b is formed between the adjacent main trenches 15a and extends in the y-direction. More specifically, the dummy trench 15b forms a meandering shape in such a manner that the dummy trench 15b extends in the y-direction while having a plurality of turning back portions in the x-direction. In the present disclosure, "including a direction component orthogonal to the extension direction" means that the dummy trench 15b is formed so as to be orthogonal to the y-direction or extend diagonally and corresponds to a portion extending in the x-direction in the meandering shape in the semiconductor device 100 in the present embodiment. The dummy trench 15b is formed to be line symmetric in the x-direction even when any of the main trenches 15a is selected as a symmetry axis.

The emitter region 19 in the present embodiment is formed intermittently and periodically in the y-direction while being in contact with the main trench 15a as shown in FIG. 2. Then, the emitter regions 19 being in contact with the adjacent main trenches 15a in the x-directions are shifted each other by a half period in the y-direction. The dummy trench 15b forms the meandering shape at the same period as a formation period of the emitter region 19 along the y-direction. Because the dummy trench 15b in the present embodiment has the meandering shape, a surface area of the dummy trench 15b in the semiconductor substrate 10 is large compared with the main trench 15a having the linear shape. Furthermore, in the semiconductor device 100, because the main trench 15a and the dummy trench 15b are alternately formed in the x-direction, a contact area between a portion of the dummy trench 15b opposing the main trench 15a and the charge accumulation region 13 is larger than a contact area between the charge accumulation region 13 and the main trench 15a.

The body region 14 and the emitter region 19 in the present embodiment respectively correspond to the first region and the second region. The p-conductivity type and the n-conductivity type respectively correspond to the first conductivity type and the second conductivity type.

Figure 5:
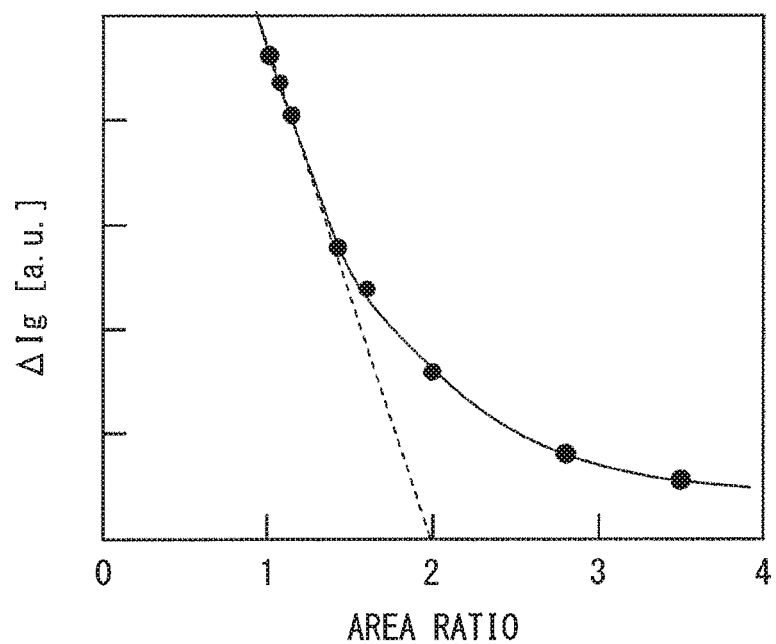
FIG. 5 is a diagram showing a simulation result.
Figure 6:
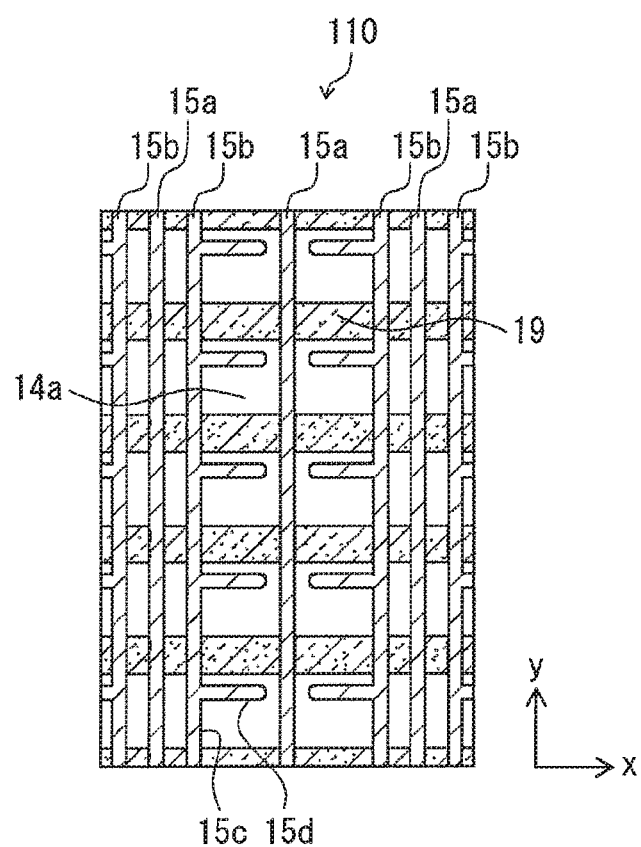
FIG. 6 is a top view showing shapes of trench gates according to a second embodiment.

Although FIG. 2 is the top view, a hatching common to FIG. 1 is given to facilitate discrimination of formation positions of the trench gate 15 and the emitter region 19. Regarding hatchings, FIG. 5 and FIG. 6 are also similar.

Next, working effects of the semiconductor device 100 according to the present embodiment will be described with reference to FIG. 3A to FIG. 5.

The inventor carried out a simulation about a relationship between the contact area between the charge accumulation region 13 and the dummy trench 15b and a change amount of a gate current Ig that causes a negative capacitance. A model subjected to the simulation is an IGBT in which the main trench 15a and the dummy trench 15b are formed concentrically around an origin O. In the model, the main trench 15a and the dummy trench 15b are formed adjacently and opposes to each other.

The main trench 15a is formed at a position of the radius R, and the dummy trench 15b is formed at a position of the radius R+ΔR. The charge accumulation region 13 is formed over the whole area of the semiconductor substrate 10 in parallel with the first main surface 10a, and a peak concentration of impurities of the charge accumulation region 13 (referred to as a CS concentration) is $1 \times 10^{-17}$ cm$^3$.

The simulation is carried out at a condition that ΔR is fixed to 1.5 μm. Thus, an area ratio of a contact area Si between the dummy trench 15b and the charge accumulation region 13, formed adjacently to surround the main trench 15a, to a contact area between the charge accumulation region 13 and the main trench 15a is equal to (R+ΔR)/R. Because ΔR is fixed, the area ratio approaches 1/1 when R is increased. An executor of the simulation can assign the area ratio optionally using R as a variable. The areas of the model are adjusted so that the gate charge amount Qg is fixed to each R. In the simulation, a temporal change of the gate current Ig is calculated for a plurality of area ratios under a condition that a sine wave voltage of 25 kHz is applied to the main trench 15a in a state of applying a voltage to the collector electrode 20.

Figure 4:
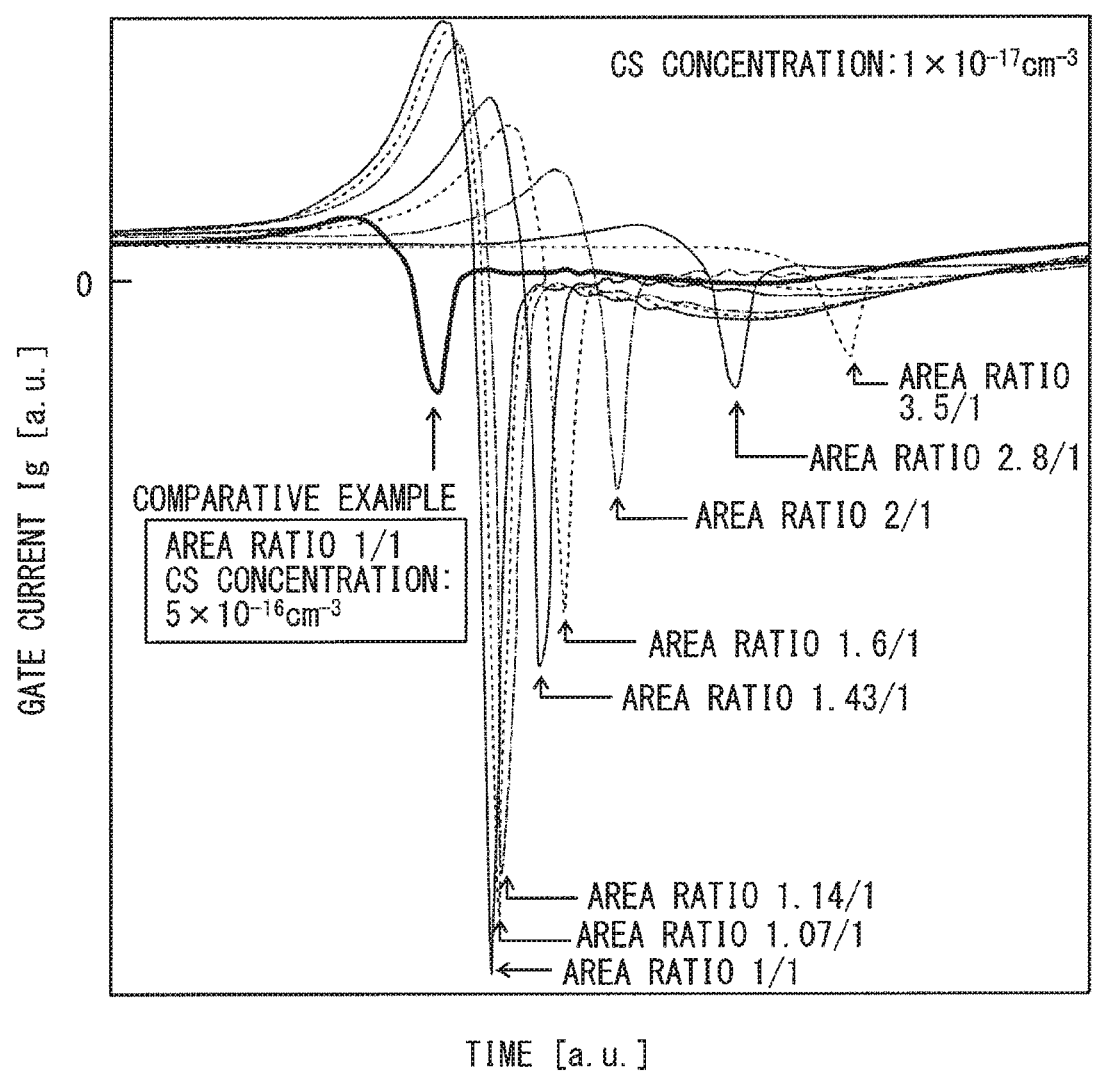
FIG. 4 is a diagram showing a simulation result.

FIG. 4 shows the result of executing the simulation. In the area ratio shown in FIG. 4, a numerator indicates the contact area between the charge accumulation region 13 and the dummy trench 15b, and the denominator Indicates the contact area between the charge accumulation region 13 and the main trench 15a. A bold solid line Indicates a comparative example and shows a result of temporal change of Ig under a condition that only the CS concentration is reduced by half with respect to $1 \times 10^{-17}$ cm$^{-3}$ while the area ratio is 1/1 and a peak depth and a half-value width are fixed.

According to FIG. 4, an effect of reducing the change amount of Ig can be provided with increasing the area ratio. For example, at a level of area ratio 2.8/1, the effect of reducing Ig change equivalent to a level of reducing the CS concentration by half while keeping the area ratio to 1/1 can be obtained. In other words, even when the CS concentration is required to be increased for reducing the on-voltage, when the contact area between the charge accumulation region 13 and the dummy trench 15b is set to be larger than the contact area between the charge accumulation region 13 and the main trench 15a, the generation of the negative capacitance can be restricted, and unintended change of the gate current Ig due to the negative capacitance can be reduced.

In the semiconductor device 100 according to the present embodiment, a p-channel parasitic MOS transistor is composed of the body region 14, the charge accumulation region 13, and the drift region 12. When the contact area between the dummy trench 15b and the charge accumulation region 13 adjacent to the main trench is increased, the channel width increases, a channel resistance of the charge accumulation region 13 decreases, and the potential change of the charge accumulation region 13 is restricted. Thus, increasing the area ratio of the contact area between the portion of the dummy trench 15b opposing the main trench 15a and the charge accumulation region 13 to the contact area between the charge accumulation region 13 and the main trench 15a provides the above-described effect of restricting the negative capacitance. The charge accumulation region 13 is divided by the trench gate 15, and potentials are independent from each other. Thus, the effect of restricting the charge accumulation region 13 that is in contact with the main trench 15a is contributed by the area of contact portion between the charge accumulation region 13 sandwiched by the main trench 15a and the dummy trench 15b adjacent to the main trench 15a. The total of the above-described areas of all of the dummy trenches 15b is the contact area between the dummy trench and the charge accumulation region.

A conventional IGBT has an issue that a CS concentration needs to be reduced for reducing a change amount of Ig that causes a negative capacitance, however, an on-voltage increases when the CS concentration is reduced. In other words, the on-voltage and the change amount of Ig are in a trade-off relationship. In the semiconductor device according to the present embodiment, while the main trench 15a is formed into the linear shape, the dummy trench 15b is formed into the meandering shape. Thus, the contact area between the charge accumulation region 13 and the dummy trench 15b is larger than the contact area between the charge accumulation region 13 and the main trench 15a. Therefore, as described above, the change amount of Ig can be reduced without reducing the CS concentration. That is, the trade-off relationship between the on-voltage and the change amount of Ig can be cancelled.

By the way, as shown in FIG. 4, when the area ratio of the contact area between the dummy trench and the charge accumulation region to the contact area between the charge accumulation region and the main trench increases, the change amount of the gate current Ig, that is, a value ΔIg of peak to peak with respect to time decreases. FIG. 5 is a graph showing a change of the change amount ΔIg of the gate current Ig with the area ratio as the horizontal axis. With increase of the area ratio, ΔIg decreases and approaches zero. This means, as described above, when the contact area between the charge accumulation region 13 and the dummy trench 15b is increased to be larger than the contact area between the charge accumulation region 13 and the main trench 15a, the generation of the negative capacitance is restricted, and unintentional change of the gate current Ig that causes the negative capacitance can be reduced. Especially, as shown in FIG. 5, when the area ratio of the contact area between the dummy trench and the charge accumulation region to the contact area between the charge accumulation region and the main trench is greater than or equal to 2, the change of the gate current Ig can be remarkably reduced.

Second Embodiment

The shape of the dummy trench 15b is not limited to the meandering shape. For example, in a semiconductor device 110 according to the second embodiment, as shown in FIG. 5, the dummy trench 15b has an approximately ladder shape in a front view of the first main surface 10a. Specifically, the dummy trench 15b has a trunk portion 15c extending in parallel with the main trench 15a and a branch portion 15d, and the branch portion 15d extends in the x-direction that is orthogonal to the trunk portion 15c. In the dummy trench 15b according to the present embodiment, a direction component that is orthogonal to the extending direction of the main trench 15a corresponds to the branch portion 15d. The dummy trench 15b is formed to be line symmetry in the x-direction even when any main trench 15a is selected as a symmetry axis.

The body region 14 and the emitter region 19 in the semiconductor device 110 have a stripe shape in which the body region 14 and the emitter region 19 are periodically formed so as to be alternately arranged in the y-direction and extend in the x-direction. As shown in FIG. 6, the branch portion 15d of the dummy trench 15b is formed in the body region 14.

In the semiconductor device 110 according to the present embodiment, the contact area between the main trench 15a and the charge accumulation region 13 and the contact area between the trunk portion 15c and the charge accumulation region 13 are almost the same, however, the dummy trench 15b has the branch portion 15d protruding from the trunk portion 15c. Thus, compared with the main trench 15a, the contact area with the charge accumulation region 13 can be large. Therefore, similarly to the effect of the first embodiment, the change amount of Ig can be reduced without reducing the CS concentration. That is, the trade-off relationship between the on-voltage and the change amount of Ig can be cancelled.

Third Embodiment

Figure 7:
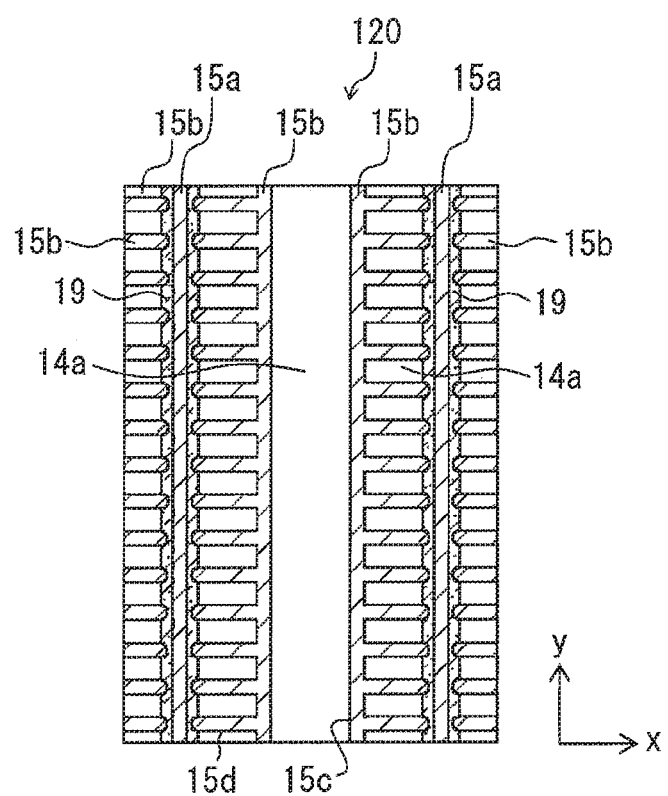
FIG. 7 is a top view showing shapes of trench gates according to a third embodiment.

In the semiconductor device 110 according to the second embodiment, the body region 14 and the emitter region 19 have stripe shape in which the body region 14 and the emitter region 19 are periodically formed so as to be alternately arranged in the y-direction and extend in the x-direction. On the other hand, in a semiconductor device 120 according to a third embodiment, as shown in FIG. 7, the body region 14 and the emitter region 19 have stripe shapes in which the body region 14 and the emitter region 19 are periodically formed so as to be alternately arranged in the x-direction and extend in the y-direction. The emitter region 19 is formed into a linear shape so as to be in contact with the main trench 15a along the y-direction. In the semiconductor device 120, the emitter region 19 extending in the x-direction as the second embodiment is not present. Thus, a connection position of the trunk portion 15c and the branch portion 15d of the dummy trench 15b can be optionally set. In other words, a formation density of the branch portion 15d in the y-direction can be higher than the second embodiment. Accordingly, the area ratio of the contact area between the charge accumulation region 13 and the dummy trench 15b to the contact area between the charge accumulation region 13 and the main trench 15a can be larger than the second embodiment. Thus, the change amount of Ig can be reduced more effectively without reducing the CS concentration.

Fourth Embodiment

In the semiconductor device 100 according to the first embodiment, the main trench 15a and the dummy trench 15b of the trench gate 15 have the same formation depth of the trench 16 from the first main surface 10a. On the other hand, in a semiconductor device 130 according to the present embodiment, as shown in FIG. 18, the formation depth of the main trench 15a is shallower than the dummy trench 15b.

Accordingly, a gate capacitance can be small at a portion being in contact with the charge accumulation region 13 and the drift region 12 that are n-conductivity type impurity regions, and a switching loss of the IGBT can be reduced.

By the way, at the trench gate 15, a breakdown voltage is improved when the trench gate 15 is formed at high density. Therefore, especially like the third embodiment, in a case where the density of the branch portion 15d of the dummy trench 15b can be higher than the second embodiment, setting the formation depth of the trench 16 in the main trench 15a to be shallower than the dummy trench 15b can reduce the gate capacitance while maintaining the breakdown voltage compared with the second embodiment. That is, the switching loss can be reduced.

Figure 8:
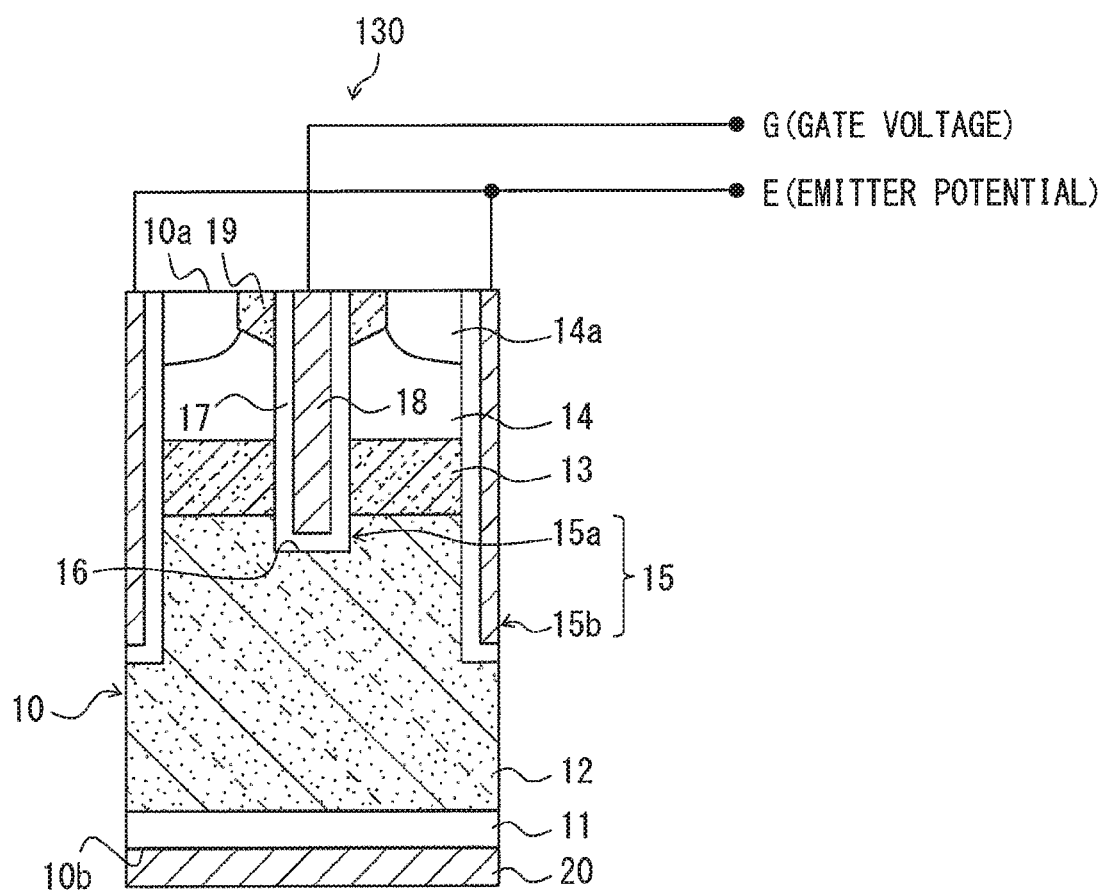
FIG. 8 is a cross-sectional view showing a schematic configuration of a semiconductor device according to a fourth embodiment.

A cross-sectional view in FIG. 8 shows a cross section taken along line I-I In FIG. 2, and the formation position of the emitter region 19 conforms to the first embodiment. However, the aspect of the trench gate 15 according to the present embodiment can also be applied to the second embodiment and the third embodiment.

Fifth Embodiment

In the semiconductor device 100 according to the first embodiment, the thickness of the insulation layer 17 is uniform on the inner wall of the trench 16 both in the main trench 15a and the dummy trench 15b. On the other hand, in a semiconductor device 140 according to the present embodiment, as shown in FIG. 9, the insulation layer 17 in the main trench 15a is thicker at a portion being in contact with the charge accumulation region 13 and the drift region 12 that are n-conductivity type impurity regions than the other portion.

Accordingly, the gate capacitance can be reduced and the switching loss of the IGBT can be reduced compared with the first to fourth embodiments.

Figure 9:
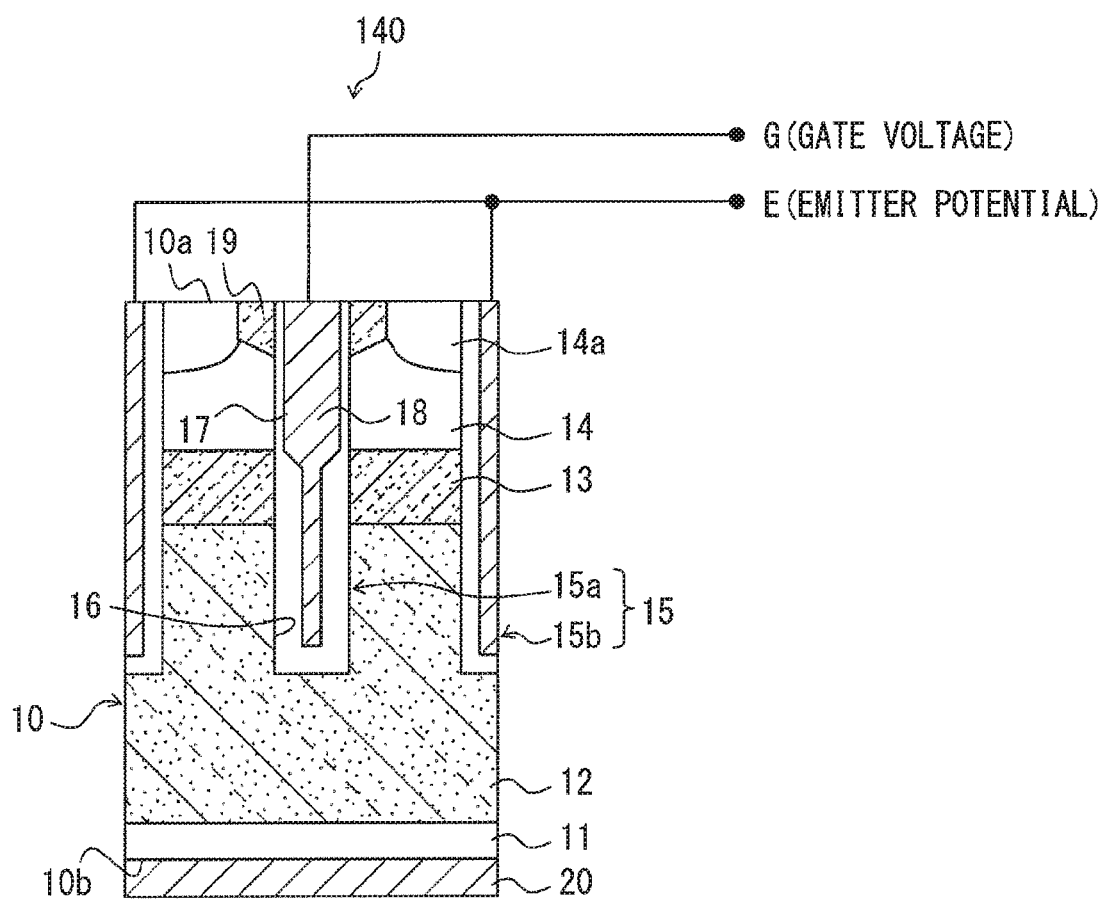
FIG. 9 is a cross-sectional view showing a schematic configuration of a semiconductor device according to a fifth embodiment.

A cross-sectional view in FIG. 9 shows a cross section taken along line I-I in FIG. 2, and the formation position of the emitter region 19 conforms to the first embodiment. However, the aspect of the trench gate 15 according to the present embodiment can also be applied to the second embodiment and the third embodiment.

Other Embodiments

While the embodiments of the present disclosure have been described, the present disclosure is not limited to the embodiments, and can be carried out with various modification within a range not deviating from the substance of the present disclosure.

Figure 10:
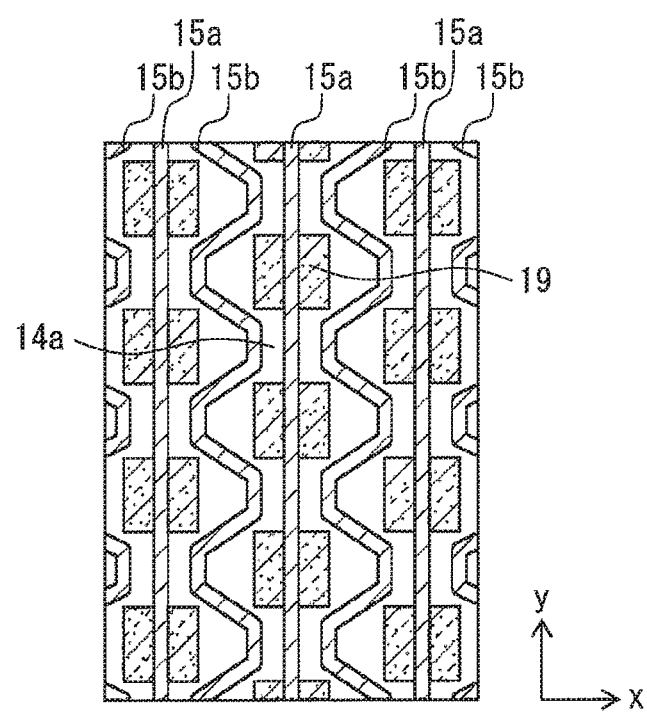
FIG. 10 is a top view showing shapes of trench gates according to another embodiment.

In each of the above-described embodiments, the x-direction component of the dummy trench 15b, that is, the component orthogonal to the extending direction of the main trench 15a is parallel. This is, for example, the portion extending in the x-direction in the meandering shape in the first embodiment, and the branch portion 15d In the second and third embodiments. However, the x-direction component in the dummy trench 15b is not always limited to the portion parallel to the x-direction. For example, as shown in FIG. 10, the dummy trench 15b may have a portion extending diagonally to the extending direction (the y-direction) of the main trench 15a. The portion diagonal to the y-direction extends to the x-direction while extending in the y-direction and includes the x-direction component.

In each embodiment, it is preferable that the creeping distance of the portion including the x-direction component in the dummy trench 15b is set to be longer than the creeping distance of the portion along the y-direction. Accordingly, at least the contact area between the charge accumulation region 13 and the dummy trench 15b can be larger than the contact area between the charge accumulation region 13 and the main trench 15a.

In each of the above-described embodiments, the gate electrode 18 in the dummy trench 15b is equipotential with the emitter region 19. However, the gate electrode 18 in the dummy trench 15b is not always equipotential with the emitter region 19. For example, based on the emitter region 19, a negative voltage of polarity opposite to the gate voltage applied to the gate electrode 18 in the main trench 15a may be applied to the gate electrode 18 of the dummy trench 15b.

In each of the above-described embodiments, the p-conductivity type and the n-conductivity type respectively correspond to the first conductivity type and the second conductivity type. However, the relationship of the conductivity types may be reversed each other.

In each of the above-described embodiment, the IGBT is described as an example of the semiconductor device 100. However, the same effects can be obtained when the present disclosure is applied to a reverse-conducting insulated gate bipolar transistor (RC-IGBT) provided with a freewheel diode.

The invention claimed is:
1. A semiconductor device comprising:
a semiconductor substrate having a first main surface and a second main surface that is a rear surface of the first main surface;
a first region of a first conductivity type formed in a surface layer of the first main surface;
a drift region of a second conductivity type different from the first conductivity type formed between the first region and the second main surface so as to be adjacent to the first region;

a charge accumulation region of the second conductivity type formed adjacent to the drift region and having an impurity concentration higher than an impurity concentration of the drift region;

a trench gate including a trench that penetrates the first region and the charge accumulation region from the first main surface in a depth direction that is perpendicular to the first main surface, an insulation layer disposed on an inner wall of the trench, and a gate electrode disposed on the insulation layer in the trench; and a second region of the second conductivity type surrounded by the first region and being exposed from the first main surface while being in contact with the trench gate, wherein the trench gate includes a main trench and a dummy trench, the main trench and the dummy trench sandwich the charge accumulation region, and a contact area between the dummy trench and the charge accumulation region is larger than a contact area between the main trench and the charge accumulation region, and an area ratio of the contact area between the dummy trench and the charge accumulation region to the contact area between the main trench and the charge accumulation region is greater than or equal to 2.

2. The semiconductor device according to claim 1, wherein the main trench longitudinally extends along a first direction in a top view of the first main surface, the first direction is orthogonal to the depth direction, and the dummy trench has a direction component orthogonal to the first direction.

3. The semiconductor device according to claim 2, wherein the dummy trench includes a meandering shape that has a plurality of turning back portions in a direction orthogonal to the first direction of the main trench in the top view of the first main surface.

4. The semiconductor device according to claim 2, wherein the dummy trench has a trunk portion along the first direction of the main trench and a branch portion extending from the trunk portion and having the direction component orthogonal to the first direction in the top view of the first main surface.

5. The semiconductor device according to claim 2, wherein a length of the dummy trench along the first main surface including the direction component orthogonal to the first direction of the main trench is longer than a length of the dummy trench along the first main surface along the first direction of the main trench in the top view of the first main surface.

6. The semiconductor device according to claim 1, wherein a depth of the trench in the main trench is less than a depth of the trench in the dummy trench in the depth direction.

\* \* \* \* \*